United States Patent
Furubayashi et al.

(10) Patent No.: US 9,899,044 B2
(45) Date of Patent: Feb. 20, 2018

(54) MAGNETORESISTIVE ELEMENT, MAGNETIC HEAD USING MAGNETORESISTIVE ELEMENT, AND MAGNETIC REPRODUCING DEVICE

(71) Applicant: NATIONAL INSTITUTE FOR MATERIALS SCIENCE, Tsukuba-shi, Ibaraki (JP)

(72) Inventors: Takao Furubayashi, Tsukuba (JP); Yukiko Takahashi, Tsukuba (JP); Kazuhiro Hono, Tsukuba (JP); Ye Du, Tsukuba (JP)

(73) Assignee: NATIONAL INSTITUTE FOR MATERIALS SCIENCE, Tsukuba-Shi, Ibaraki (JP)

( * ) Notice: Subject to any disclaimer, the term of this patent is extended or adjusted under 35 U.S.C. 154(b) by 0 days.

(21) Appl. No.: 15/500,713

(22) PCT Filed: Jul. 28, 2015

(86) PCT No.: PCT/JP2015/071313
§ 371 (c)(1),
(2) Date: Jan. 31, 2017

(87) PCT Pub. No.: WO2016/017612
PCT Pub. Date: Feb. 4, 2016

(65) Prior Publication Data
US 2017/0221507 A1  Aug. 3, 2017

(30) Foreign Application Priority Data

Aug. 1, 2014 (JP) .................. 2014-157468
Mar. 31, 2015 (JP) .................. 2015-071954

(51) Int. Cl.
G11B 5/39 (2006.01)
G11B 5/40 (2006.01)
G11B 5/127 (2006.01)

(52) U.S. Cl.
CPC .......... *G11B 5/3906* (2013.01); *G11B 5/1278* (2013.01); *G11B 5/40* (2013.01); *G11B 2005/3996* (2013.01)

(58) Field of Classification Search
None
See application file for complete search history.

(56) References Cited

U.S. PATENT DOCUMENTS 7,301,733 B1  11/2007 Fukuzawa et al.
7,760,475 B2 * 7/2010 Mizuno .................. B82Y 25/00
                                                360/324

(Continued)

FOREIGN PATENT DOCUMENTS

JP    2007-59927 A    3/2007
JP    2008-52840 A    3/2008

(Continued)

OTHER PUBLICATIONS

English-machine translation of Mizuno et al. (JP 2008-078567 A), published on Apr. 3, 2008.*

(Continued)

*Primary Examiner* — Will J Klimowicz
(74) *Attorney, Agent, or Firm* — Brinks Gilson & Lione; G. Peter Nichols

(57) ABSTRACT

The present invention addresses the problem of providing an element which uses the current-perpendicular-to-plane giant magnetoresistance (CPPGMR) effect of a thin film having the three-layer structure of ferromagnetic metal/non-magnetic metal/ferromagnetic metal. The problem is solved by a magnetoresistive element provided with a lower ferromag- (Continued)

netic layer and an upper ferromagnetic layer which contain a Heusler alloy, and a spacer layer sandwiched between the lower ferromagnetic layer and the upper ferromagnetic layer, the magnetoresistive element being characterized in that the spacer layer contains an alloy having a bcc structure. Furthermore, it is preferable for the alloy to have a disordered bcc structure.

16 Claims, 7 Drawing Sheets

(56) References Cited

U.S. PATENT DOCUMENTS

| | | | | |
|---|---|---|---|---|
| 8,203,808 B2* | 6/2012 | Mizuno | ............... | B82Y 25/00 360/324.12 |
| 2007/0291422 A1* | 12/2007 | Tsuchiya | ............... | B82Y 25/00 360/324.11 |
| 2008/0062579 A1 | 3/2008 | Yasui et al. | | |

FOREIGN PATENT DOCUMENTS

| | | | | | |
|---|---|---|---|---|---|
| JP | 2008-78567 | A | | 4/2008 | |
| JP | 2008078567 | A | * | 4/2008 | |
| JP | 2010-212631 | A | | 9/2010 | |
| JP | 2011-35336 | A | | 2/2011 | |
| JP | 2011035336 | A | * | 2/2011 | |
| JP | 2011129933 | A | * | 6/2011 | ............ G11C 11/16 |
| JP | 5245179 | B2 | | 7/2013 | |
| JP | 2017027647 | A | * | 2/2017 | ............ G11B 5/39 |
| WO | WO 2016017612 | A1 | * | 2/2016 | ............ G11B 5/39 |
| WO | WO 2017017978 | A1 | * | 2/2017 | ............ G11B 5/39 |

OTHER PUBLICATIONS

English-machine translation of Nakatani et al. (JP 2011-035336 A), published on Feb. 17, 2011.*
Chen, J. et al., "Crystal Orientation Dependence of Current-Perpendicular-to-Plane Giant Magnetoresistance of Pseudo Spin-Valves with Epitaxial Co2Fe(Ge0.5Ga0.5) Heusler Alloy Layers", *Journal of Applied Physics*, vol. 115, 233905, 2014, 7 pages.
Furubayashi, T. et al., "CPPGMR Using Cu-Based bcc Alloys for a Space Layer", *38th Annual Conference on Magnetics in Japan*, 2014, 3 pages (with English language translation).
Furubayashi, T. et al., "Current-Perpendicular-to-Plane Giant Magnetoresistance Using a Heusler Alloy for Ferromagnetic Layers and a Cu-Based bcc Alloy for a Space Layer", *National Institute for Material Science*, 2014, 3 pages.
Furubayashi, T. et al., "Enhancement of CPP-GMR by CuZn Alloy Space Layer", *National Institute for Materials Science, 61st JSP Spring Meeting*, 2014, 12 pages.
Goripati, H.S. et al., "Current-Perpendicular-to-Plane Giant Magnetoresistance Using Co2Fe(Ga1-x Ge x) Heusler Alloy", *Journal of Applied Physics*, vol. 113, 043901, 2013, 6 pages.
Takahashi, Y.K. et al., "Large Magnetoresistance in Current-Perpendicular-to-Plane Pseudospin Valve Using a Co 2 Fe (Ge 0.5 Ga 0.5) Heusler Alloy", *Applied Physics Letters*, No. 98, 152501, 2011, 4 pages.
International Search Report and English language translation thereof, in corresponding International Application No. PCT/JP2015/071313, dated Oct. 20, 2015, 5 pages.
Written Opinion and English language translation thereof, in corresponding International Application No. PCT/JP2015/071313, dated Oct. 20, 2015, 10 pages.
Office Action dated Dec. 13, 2017 from corresponding Japanese Patent Application No. 2016538352 (8 pages including English translation).

* cited by examiner

MAGNETORESISTIVE ELEMENT, MAGNETIC HEAD USING MAGNETORESISTIVE ELEMENT, AND MAGNETIC REPRODUCING DEVICE

This application is a 371 application of PCT/JP2015/071313 having an international filing date of Jul. 28, 2015, which claims priority to JP2014-157468 filed Aug. 1, 2014 and JP2015-071954 filed Mar. 31, 2015. All of these applications are incorporated herein by reference.

TECHNICAL FIELD

The present invention relates to an element using a current-perpendicular-to-plane giant magnetoresistance (CPPGMR) effect of a thin film having a three-layer structure of ferromagnetic metal/non-magnetic metal/ferromagnetic metal, particularly to a magnetoresistive element using a non-magnetic spacer layer having a body-centered cubic (bcc) structure as the non-magnetic metal layer.

BACKGROUND ART

The element using a current-perpendicular-to-plane giant magnetoresistance (CPPGMR) effect is formed of a thin film having a three-layer structure of ferromagnetic metal/non-magnetic metal/ferromagnetic metal, and is expected to be used for a reading head for a magnetic disc. An element using a Heusler alloy having a large spin polarizability as a ferromagnetic metal has been studied. For example, Patent Literatures 1 and 2 have proposed use of Cu which is a metal having a face-centered cubic (fcc) structure for a spacer layer (layer of a non-magnetic metal). In addition, Non-Patent Literatures 1 and 2 have proposed use of a Heusler alloy CFGG for a magnetic layer and use of Ag which is a metal having a face-centered cubic structure for a spacer layer.

Furthermore, Non-Patent Literature 3 discloses that a magnetoresistive output is changed largely by the orientation of a Heusler alloy as a ferromagnetic layer when a spacer layer having a fcc structure of Ag or Cu is used. This is because a lattice distortion formed by the Heusler alloy having a bcc group structure and Ag or Cu having a fcc structure largely depends on a crystal orientation of the Heusler alloy. As a result, it is disclosed that high magnetoresistance can be obtained when (001) plane of the Heusler alloy constitutes an interface with the spacer layer in the case of using Ag and when (011) plane of the Heusler alloy constitutes an interface with the spacer layer in the case of using Cu. In this context, (001) and (011) each are a Miller index to describe a crystal plane or a direction in a lattice of a crystal.

However, because of magnetic conductivity dependence due to the lattice distortion formed by the Heusler alloy having a bcc group structure and Ag or Cu having a fcc structure and a crystal orientation thereof, such a magnetoresistive output as to be predicted from theoretical calculation has not been obtained.

On the other hand, it has been theoretically predicted that use of a $L2_1$ ordered alloy $Cu_2RhSn$ or a B2 type ordered alloy NiAl having the same bcc group crystal structure as the Heusler alloy for a spacer layer improves consistency at an interface of a band structure to bring about a larger magnetoresistance effect. Therefore, studies have been made based on this theoretical prediction. Patent Literatures 3 and 4 according to proposal by the present inventors disclose CPPGMR using a Heusler alloy for a magnetic layer and using a $L2_1$ type or B2 type ordered alloy for a spacer layer. However, the inventions according to Patent Literatures 3 and 4 have not obtained such an effect as to be predicted from theoretical calculation. It is considered that this is because the magnetoresistance effect is weakened by an effect of strong spin-orbit scattering or spin scattering due to a relatively heavy element Rh.Sn or a magnetic element Ni contained in these alloys.

CITATION LIST

Patent Literatures

PATENT LITERATURE 1: JP 2007-59927 A
PATENT LITERATURE 2: JP 2008-52840 A
PATENT LITERATURE 3: JP 2010-212631 A
PATENT LITERATURE 4: JP 5245179 B2

Non-Patent Literatures

NON-PATENT LITERATURE 1: Appl. Phys. Lett. 98, 152501 (2011).
NON-PATENT LITERATURE 2: J. Appl. Phys. 113, 043901 (2013).
NON-PATENT LITERATURE 3: Jiamin Chen, Songtian Li, T. Furubayashi, Y. K. Takahashi and K. Hono, J. Appl. Phys. 115, 233905 (2014)

SUMMARY OF INVENTION

Technical Problem

The present invention has solved the above problems. An object thereof is to provide a magnetoresistive element exhibiting a higher magnetoresistive output than a conventional structure in an element using a current-perpendicular-to-plane giant magnetoresistance (CPPGMR) effect of a thin film having a three-layer structure of ferromagnetic metal/non-magnetic metal/ferromagnetic metal.

Solution to Problem

In order to solve the above problems, the present invention is a magnetoresistive element having the following configuration.

For example, as illustrated in FIG. 1, the magnetoresistive element of the present invention includes a lower ferromagnetic layer 13 and an upper ferromagnetic layer each formed of a Heusler alloy, and a spacer layer 14 sandwiched between the lower ferromagnetic layer 13 and the upper ferromagnetic layer 15, and is characterized in that the spacer layer 14 is formed of an alloy or an intermetallic compound having a bcc structure.

In the magnetoresistive element of the present invention, the alloy or the intermetallic compound is preferably selected from the group consisting of CuZn, $Cu_3Al$, CuBe, $Ag_3Al$, AgMg, and AgZn.

In the magnetoresistive element of the present invention, the alloy or the intermetallic compound is preferably at least one selected from the group consisting of an alloy having a bcc structure formed of Cu and Zn, an alloy having a bcc structure formed of Cu and Al, an alloy having a bcc structure formed of Cu and Be, an alloy having a bcc structure formed of Ag and Al, an alloy having a bcc structure formed of Ag and Mg, and an alloy having a bcc structure formed of Ag and Zn.

In the magnetoresistive element of the present invention, the alloy or the intermetallic compound preferably has a disordered bcc structure.

In the magnetoresistive element of the present invention, a substrate 11 is preferably at least one selected from the group consisting of a surface oxidized Si substrate, a silicon substrate, a glass substrate, a metal substrate, and an MgO substrate.

For example, as illustrated in FIG. 1, the magnetoresistive element of the present invention is preferably stacked on a base layer (also referred to as an orientation layer) 12 formed on the substrate 11 to epitaxially grow a Heusler alloy in a predetermined crystal direction. The base layer 12 preferably contains at least one metal or alloy selected from the group consisting of Ag, Al, Cu, Au, and Cr. A crystal direction in which the Heusler alloy is grown epitaxially is preferably (001) direction.

In the magnetoresistive element of the present invention, each of the lower ferromagnetic layer 13 and the upper ferromagnetic layer 15 preferably contains a Heusler alloy represented by the composition formula $Co_2AB$. The aforementioned A is Cr, Mn, Fe, or a mixture of two or more species thereof in which the total amount thereof is 1. The aforementioned B is Al, Si, Ga, Ge, In, Sn, or a mixture of two or more species thereof in which the total amount thereof is 1.

In the magnetoresistive element of the present invention, each of the lower ferromagnetic layer 13 and the upper ferromagnetic layer 15 is preferably formed of a Heusler ferromagnetic alloy having a B2 ordered structure or a $L2_1$ ordered structure, and the Heusler ferromagnetic alloy preferably contains a Heusler ferromagnetic alloy selected from the group consisting of $Co_2Fe(Ga_xGe_{x-1})$ ($0.25<x<0.6$), CoFeAlSi, CoMnSi, CoMnGe, CoFeAl, and CoFeSi.

In the magnetoresistive element of the present invention, a base layer 12b as an electrode for measuring magnetoresistance is preferably further disposed while being sandwiched between the base layer 12 and the lower ferromagnetic layer 13.

The magnetoresistive element of the present invention preferably further includes a cap layer 16 for protecting a surface, stacked on the upper ferromagnetic layer 15, and the cap layer 16 is preferably formed of at least one metal or alloy selected from the group consisting of Ag, Al, Cu, Au, Ru, and Pt.

The magnetoresistive element of the present invention preferably further includes a pinning layer disposed on the upper ferromagnetic layer 15 or under the lower ferromagnetic layer 13, and the pinning layer is preferably a layer of an antiferromagnetic substance such as an IrMn alloy or a PtMn alloy.

In the magnetoresistive element having such a configuration, by suppressing magnetization reversal of the upper ferromagnetic layer by exchange anisotropy, the upper ferromagnetic layer and the lower ferromagnetic layer magnetized antiparallel can be stabilized.

For example, as illustrated in FIG. 1, the current-perpendicular-to-plane giant magnetoresistance (CPPGMR) element of the present invention is characterized by the following. That is, the current-perpendicular-to-plane giant magnetoresistance (CPPGMR) element includes the spacer layer 14 between the Heusler alloy thin films (13 and 15). Each of the Heusler alloy thin films is formed of a Heusler ferromagnetic alloy having a B2 ordered structure or a $L2_1$ ordered structure. The Heusler ferromagnetic alloy is selected from the group consisting of $Co_2Fe(Ga_xGe_{x-1})$ ($0.25<x<0.6$), CoFeAlSi, CoMnSi, CoMnGe, CoFeAl, and CoFeSi. The spacer layer 14 is formed of an alloy or an intermetallic compound having a bcc structure. The alloy or the intermetallic compound is selected from the group consisting of CuZn, $Cu_3Al$, CuBe, $Ag_3Al$, AgMg, and AgZn.

Here, when $Co_2Fe(Ga_xGe_{x-1})$ has a Ga ratio x of 0.25 or less or a Ga ratio x of 0.6 or more, magnetoresistance is lowered disadvantageously due to reduction of a spin polarizability. The Ga ratio x in $(Ga_xGe_{x-1})$ is preferably between 0.25 and 0.6, and more preferably between 0.45 and 0.55.

The present invention and preferable embodiments thereof will be listed as follows:

[1] A magnetoresistive element including a lower ferromagnetic layer and an upper ferromagnetic layer each containing a Heusler alloy, and a spacer layer sandwiched between the lower ferromagnetic layer and the upper ferromagnetic layer, characterized in that the spacer layer contains an alloy having a bcc structure.

[2] The magnetoresistive element described in [1], characterized in that the alloy is at least one selected from the group consisting of CuZn, $Cu_3Al$, CuBe, $Ag_3Al$, AgMg, and AgZn.

[3] The magnetoresistive element described in [1], characterized in that the alloy is at least one selected from the group consisting of an alloy having a bcc structure formed of Cu and Zn, an alloy having a bcc structure formed of Cu and Al, an alloy having a bcc structure formed of Cu and Be, an alloy having a bcc structure formed of Ag and Al, an alloy having a bcc structure formed of Ag and Mg, and an alloy having a bcc structure formed of Ag and Zn.

[4] The magnetoresistive element described in any one of [1] to [3], in which the alloy has a disordered bcc structure.

[5] The magnetoresistive element described in any one of [1] to [4], further including a substrate, characterized in that the substrate is at least one selected from the group consisting of a surface oxidized Si substrate, a silicon substrate, a glass substrate, a metal substrate, and an MgO substrate.

[6] The magnetoresistive element described in [5], further including an orientation layer formed on the substrate to epitaxially grow the Heusler alloy in a predetermined crystal direction, characterized in that the orientation layer contains at least one metal selected from the group consisting of Ag, Al, Cu, Au, and Cr or an alloy thereof, and a crystal direction in which the Heusler alloy is grown epitaxially is (001) direction.

[7] The magnetoresistive element described in any one of [1] to [6], characterized in that each of the lower ferromagnetic layer and the upper ferromagnetic layer contains a Heusler alloy represented by the composition formula $Co_2AB$, the aforementioned A is Cr, Mn, Fe, or a combination of two or more species thereof (the total amount of A is 1), and the B is Al, Si, Ga, Ge, In, Sn, or a combination of two or more species thereof (the total amount of B is 1).

[8] The magnetoresistive element described in [7], characterized in that each of the lower ferromagnetic layer and the upper ferromagnetic layer contains a Heusler ferromagnetic alloy having a B2 ordered structure or a $L2_1$ ordered structure, and the Heusler ferromagnetic alloy is selected from the group consisting of $Co_2Fe(Ga_xGe_{x-1})$ ($0.25<x<0.6$), $Co_2FeAl_{0.5}Si_{0.5}$, $Co_2MnSi$, $Co_2MnGe$, $Co_2FeAl$, and $Co_2FeSi$.

[9] The magnetoresistive element described in any one of [6] to [8], further including a base layer as an electrode for measuring magnetoresistance, characterized in that the base layer is disposed between the orientation layer and the lower ferromagnetic layer.

[10] The magnetoresistive element described in any one of [1] to [9], further including a cap layer for protecting a surface, stacked on the upper ferromagnetic layer, characterized in that the cap layer contains at least one metal selected from the group consisting of Ag, Al, Cu, Au, Ru, and Pt or an alloy thereof.

[11] The magnetoresistive element described in any one of [1] to [10], further including a pinning layer disposed on the upper ferromagnetic layer or under the lower ferromagnetic layer, characterized in that the pinning layer is a layer of an antiferromagnetic substance such as an IrMn alloy or a PtMn alloy.

[12] A current-perpendicular-to-plane giant magnetoresistance (CPPGMR) element including at least one spacer layer between at least two Heusler alloy thin films, characterized in that each of the Heusler alloy thin films contains a Heusler ferromagnetic alloy having a B2 ordered structure or a $L2_1$ ordered structure, the Heusler ferromagnetic alloy is selected from the group consisting of $Co_2Fe(Ga_xGe_{x-1})$ $(0.25<x<0.6)$, $Co_2FeAl_{0.5}Si_{0.5}$, $Co_2MnSi$, $Co_2MnGe$, $Co_2FeAl$, and $Co_2FeSi$, the spacer layer contains an alloy having a bcc structure, and the alloy is selected from the group consisting of CuZn, $Cu_3Al$, CuBe, $Ag_3Al$, AgMg, and AgZn.

[13] The current-perpendicular-to-plane giant magnetoresistance (CPPGMR) element described in [12], in which the alloy has a disordered bcc structure.

[14] A magnetic head characterized by including the magnetoresistive element described in any one of [1] to [11] or the current-perpendicular-to-plane giant magnetoresistance element described in [12] or [13].

[15] A magnetic reproducing device characterized by including the magnetic head described in [14].

The present invention and preferable embodiments thereof can be listed also as follows:

[1] A magnetoresistive element including a lower ferromagnetic layer and an upper ferromagnetic layer each formed of a Heusler alloy, and a spacer layer sandwiched between the lower ferromagnetic layer and the upper ferromagnetic layer, characterized in that the spacer layer is formed of an intermetallic compound having a bcc structure.

[2] The magnetoresistive element described in [1], characterized in that the intermetallic compound is selected from the group consisting of CuZn, $Cu_3Al$, CuBe, $Ag_3Al$, AgMg, and AgZn.

[3] The magnetoresistive element described in [1], characterized in that the intermetallic compound is an intermetallic compound of at least one alloy selected from the group consisting of an alloy having a bcc structure formed of Cu and Zn, an alloy having a bcc structure formed of Cu and Al, an alloy having a bcc structure formed of Cu and Be, an alloy having a bcc structure formed of Ag and Al, an alloy having a bcc structure formed of Ag and Mg, and an alloy having a bcc structure formed of Ag and Zn.

[4] The magnetoresistive element described in any one of [1] to [3], characterized in that the substrate is at least one selected from the group consisting of a surface oxidized Si substrate, a silicon substrate, a glass substrate, a metal substrate, and an MgO substrate.

[5] The magnetoresistive element described in any one of [1] to [4], stacked on a base layer formed on the substrate to epitaxially grow a Heusler alloy in a predetermined crystal direction, characterized in that the base layer contains at least one metal or alloy selected from the group consisting of Ag, Al, Cu, Au, and Cr, and a crystal direction in which the Heusler alloy is grown epitaxially is (001) direction.

[6] The magnetoresistive element described in any one of [1] to [5], characterized in that each of the lower ferromagnetic layer and the upper ferromagnetic layer contains a Heusler alloy represented by the composition formula $Co_2AB$, the aforementioned A is Cr, Mn, Fe, or a mixture of two or more species thereof in which the total amount thereof is 1, and the B is Al, Si, Ga, Ge, In, Sn, or a mixture of two or more species thereof in which the total amount thereof is 1.

[7] The magnetoresistive element described in [6], characterized in that each of the lower ferromagnetic layer and the upper ferromagnetic layer is formed of a Heusler ferromagnetic alloy having a B2 ordered structure or a $L2_1$ ordered structure, and the Heusler ferromagnetic alloy contains a Heusler ferromagnetic alloy selected from the group consisting of $Co_2Fe(Ga_xGe_{x-1})$ $(0.25<x<0.6)$, CoFeAlSi, CoMnSi, CoMnGe, CoFeAl, and CoFeSi.

[8] The magnetoresistive element described in any one of [1] to [7], further including a base layer as an electrode for measuring magnetoresistance while the base layer is sandwiched between the base layer and the lower ferromagnetic layer.

[9] The magnetoresistive element described in any one of [1] to [8], further including a cap layer for protecting a surface, stacked on the upper ferromagnetic layer, characterized in that the cap layer contains at least one metal or alloy selected from the group consisting of Ag, Al, Cu, Au, Ru, and Pt.

[10] The magnetoresistive element described in any one of [1] to [9], further including a pinning layer disposed on the upper ferromagnetic layer or under the lower ferromagnetic layer, characterized in that the pinning layer is a layer of an antiferromagnetic substance such as an IrMn alloy or a PtMn alloy.

[11] A current-perpendicular-to-plane giant magnetoresistance (CPPGMR) element including a spacer layer between Heusler alloy thin films, characterized in that each of the Heusler alloy thin films is formed of a Heusler ferromagnetic alloy having a B2 ordered structure or a $L2_1$ ordered structure, the Heusler ferromagnetic alloy is selected from the group consisting of $Co_2Fe(Ga_xGe_{x-1})$ $(0.25<x<0.6)$, CoFeAlSi, CoMnSi, CoMnGe, CoFeAl, and CoFeSi, the spacer layer is formed of an intermetallic compound having a bcc structure, and the intermetallic compound is selected from the group consisting of CuZn, $Cu_3Al$, CuBe, $Ag_3Al$, AgMg, and AgZn.

[12] A magnetic head characterized by using the magnetoresistive element described in any one of [1] to [10] or the current-perpendicular-to-plane giant magnetoresistance element described in [11].

[13] A magnetic reproducing device characterized by using the magnetic head described in [12].

Advantageous Effects of Invention

In the present invention, a relatively heavy element Rh.Sn or a magnetic element Ni is not essential unlike the prior art, but an alloy having a bcc structure, for example, a Cu-based alloy such as CuZn or $Cu_3Al$ is used for a spacer layer as a material having a low electric resistivity, suitable for the spacer layer. A larger change amount of magnetoresistance can be thereby obtained than a case of using an Ag spacer layer. The Cu alloy having a bcc group structure, used in an example of the present invention, is lattice-matched well with a Heusler alloy regardless of an orientation. Therefore, a high magnetoresistance ratio is obtained regardless of an orientation a Heusler alloy layer.

Therefore, in an example of the present invention, a CPPGMR element using a Cu alloy having a bcc group structure can be manufactured, and a high magnetoresistive output can be provided. In addition, the CPPGMR element is suitably used for a magnetic head and a magnetic reproducing device using the magnetoresistive element of the present invention.

DETAILED DESCRIPTION OF THE PREFERRED EMBODIMENTS

Hereinafter, the present invention will be described with reference to the drawings.

Figure 1:
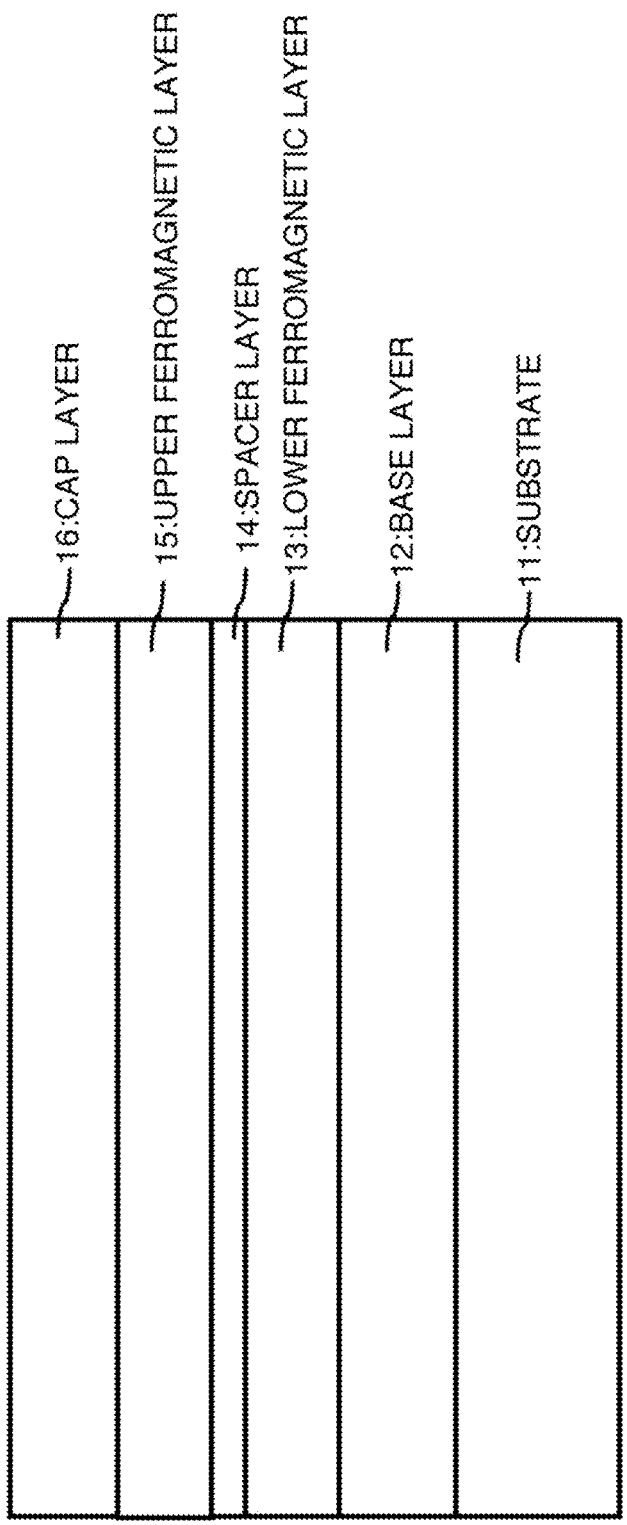
FIG. 1 is a schematic structural view of a magnetoresistive element according to an embodiment of the present invention.

FIG. 1 is a schematic structural view of a magnetoresistive element according to an embodiment of the present invention. In FIG. 1, the magnetoresistive element has a substrate 11, a base layer 12, a lower ferromagnetic layer 13, a spacer layer 14, an upper ferromagnetic layer 15, and a cap layer 16 stacked in this order.

For example, a single crystal MgO substrate is used for the substrate 11. However, the substrate 11 is not particularly limited to the single crystal MgO substrate. Si, a metal, an alloy, or the like on which a Heusler alloy layer is polycrystalline may be used for the substrate. The substrate 11 is preferably a surface oxidized Si substrate due to inexpensiveness, but may be a silicon substrate used for manufacturing a semiconductor, a glass substrate, or a metal substrate. Even when these materials are used for the substrate 11, a high magnetoresistance ratio is obtained as a magnetoresistive element.

The base layer 12 is an electrode for measuring magnetoresistance. For example, a metal containing at least one selected from the group consisting of Ag, Al, Cu, Au, and Cr, or an alloy thereof is used for the base layer 12. Note that the base layer 12 may have a two-layer structure obtained by adding a base layer 12a under a base layer 12b or a multi-layer structure having three or more layers.

Note that an orientation layer may be disposed under the base layer 12. The orientation layer orients a Heusler alloy layer in a (100) direction. For example, a layer containing at least one selected from the group consisting of an MgO alloy, a TiN alloy, and a NiTa alloy is used for the orientation layer.

Each of the lower ferromagnetic layer 13 and the upper ferromagnetic layer 15 contains a Heusler alloy represented by the composition formula Co$_2$AB. The A is Cr, Mn, Fe, or a mixture of two or more species thereof in which the total amount thereof is 1. The aforementioned B is Al, Si, Ga, Ge, In, Sn, or a mixture of two or more species thereof in which the total amount thereof is 1. The Heusler alloy is particularly preferably Co$_2$FeGa$_{0.5}$Ge$_{0.5}$ (CFGG), but may be Co$_2$FeAl$_{1-x}$Si$_x$, Co$_2$MnSi, or Co$_2$Fe$_{1-x}$Mn$_x$Si obtaining a large change amount of magnetoresistance×element area ($\Delta$RA) in CPPGMR using a (100) single crystal thin film. For each of the upper ferromagnetic layer and the lower ferromagnetic layer, one Heusler alloy may be used, or two or more Heusler alloys, other metals, or other alloys may be combined.

The spacer layer 14 is formed of a metal or an alloy. The cap layer 16 is formed of a metal or an alloy for protecting a surface. An alloy or an intermetallic compound selected from the group consisting of CuZn, Cu$_3$Al, CuBe, Ag$_3$Al, AgMg, and AgZn is used for the spacer layer 14. Furthermore, for example, a layer formed of a metal containing at least one selected from the group consisting of Ag, Al, Cu, Au, and Cr, or an alloy thereof may be added. For the spacer layer 14, at least one alloy or intermetallic compound selected from the group consisting of an alloy having a bcc structure formed of Cu and Zn, an alloy having a bcc structure formed of Cu and Al, an alloy having a bcc structure formed of Cu and Be, an alloy having a bcc structure formed of Ag and Al, an alloy having a bcc structure formed of Ag and Mg, and an alloy having a bcc structure formed of Ag and Zn may be used. It is considered that the alloy or the intermetallic compound constituting the spacer layer 14 only needs to have a bcc structure even when having a composition different from CuZn, Cu$_3$Al, CuBe, Ag$_3$Al, AgMg, or AgZn which is a typical alloy or intermetallic compound to a considerable extent. Therefore, a composition ratio of an element in the alloy or the intermetallic compound can be selected appropriately within a range constituting a bcc structure. For example, the spacer layer 14 has a thickness of 0.1 nm to 20 nm. Therefore, the alloy or the intermetallic compound forms a metal atomic layer formed of about one to 200 atoms. The thickness of the spacer layer 14 is from several atoms to several hundreds of atoms. Therefore, a crystal structure of the alloy or the intermetallic compound may be different from a bulk due to an influence by an adjacent layer such as the lower ferromagnetic layer.

For example, a metal containing at least one selected from the group consisting of Ag, Al, Cu, Au, and Cr, or an alloy thereof is used for the cap layer 16. One material may be used or two or more materials may be stacked to be used for each of the base layer 12, the spacer layer 14, and the cap layer 16.

EXAMPLE 1

Figure 4:
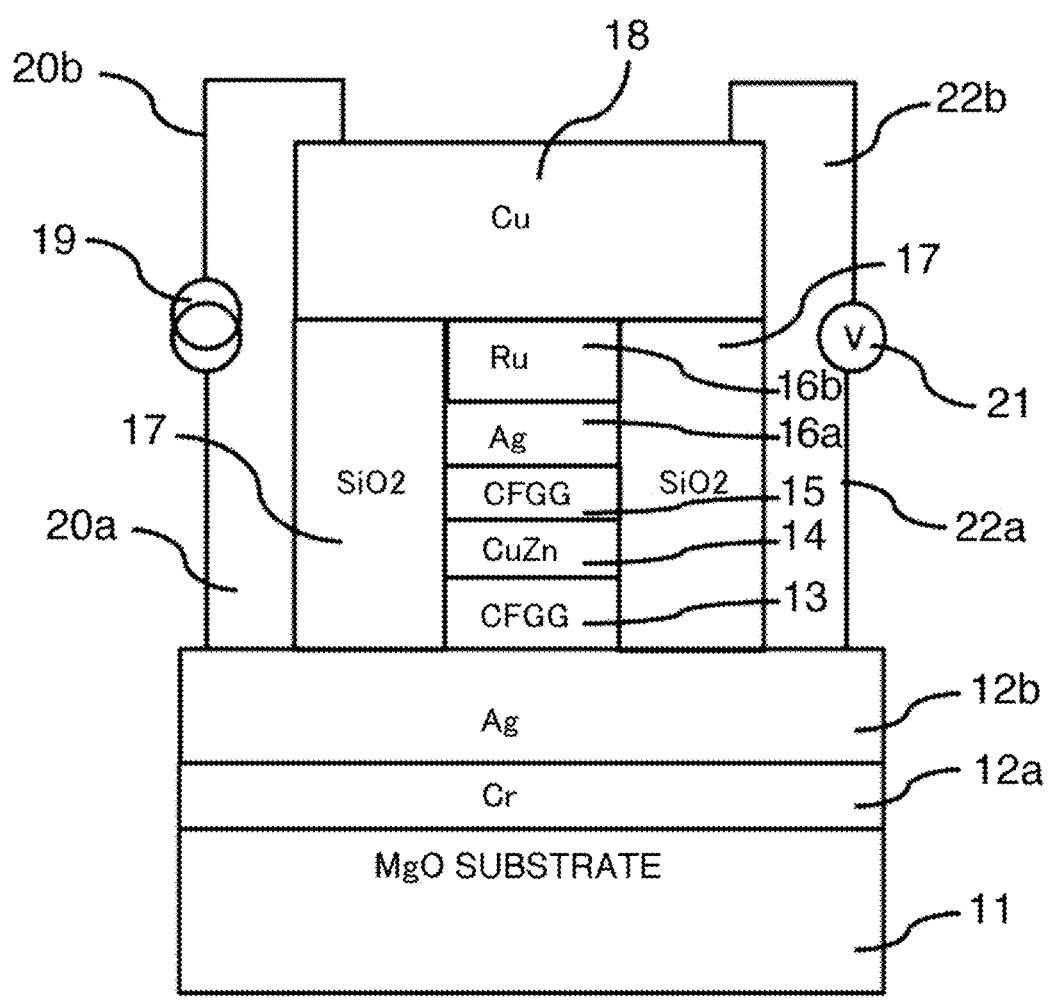
FIG. 4 is a schematic cross-sectional view of an element obtained by adding an electrode for measuring electric resistance with respect to a magnetic field to a CPPGMR element according to an embodiment of the present invention.

FIG. 1 is a schematic cross-sectional view of a CPPGMR element according to an embodiment of the present invention. FIG. 4 is a schematic cross-sectional view of an element obtained by adding an electrode for measuring electric resistance with respect to a magnetic field to a CPPGMR element according to an embodiment of the present invention. In FIG. 4, a single crystal MgO substrate is used for the substrate 11, a product obtained by stacking Cr and Ag from the bottom is used for the base layer 12, a Heusler alloy $Co_2FeGa_{0.5}Ge_{0.5}$ (CFGG) is used for each of the lower ferromagnetic layer 13 and the upper ferromagnetic layer 15, CuZn is used for the spacer layer 14, and a product obtained by stacking Ag and Ru from the bottom is used for the cap layer 16.

In the element illustrated in FIG. 1, a film was formed on an MgO substrate by a sputtering method so as to have a film configuration from the bottom of Cr(10)/Ag(100)/CFGG (10)/CuZn(5)/CFGG(10)/Ag(5)/Ru(8) in which each of the numbers in the parentheses indicates the film thickness (nm).

Figure 2:
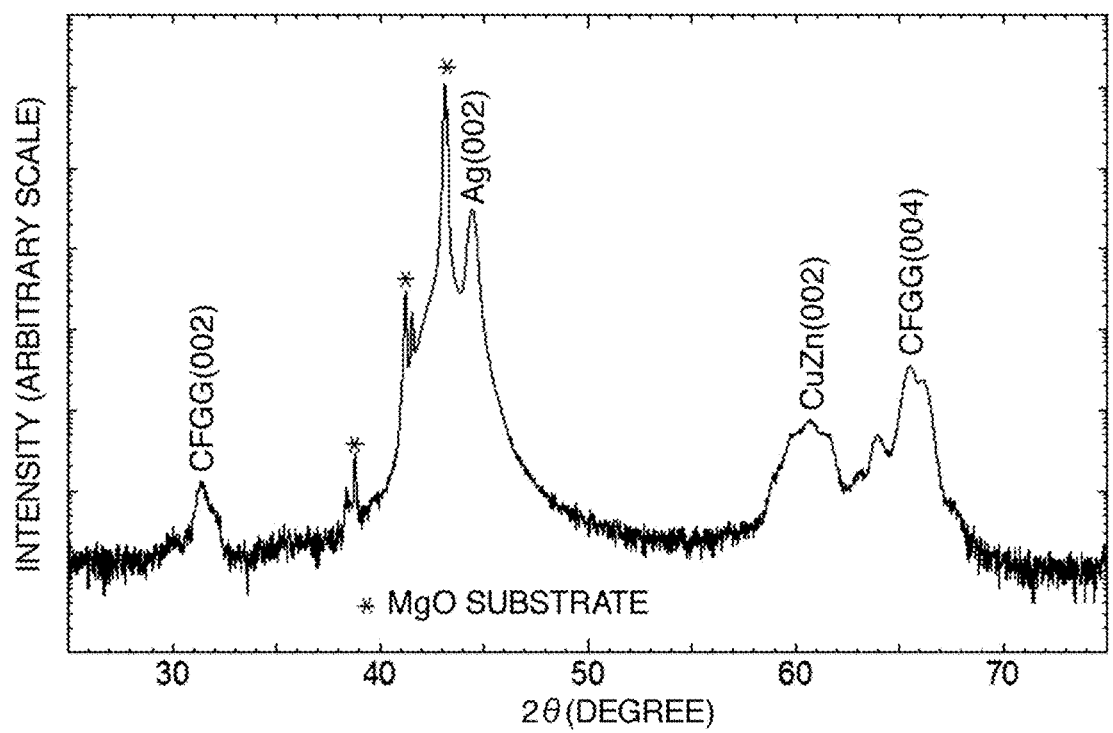
FIG. 2 is an X-ray diffraction pattern diagram of a film obtained by stacking Cr(10)/Ag(100)/CFGG(10)/CuZn(5)/CFGG(10)/Ag(5)/Ru(8) on an MgO(001) single crystal substrate from the bottom.

FIG. 2 is an X-ray diffraction pattern diagram of a CPPGMR element film having the above-mentioned stacked configuration. When the pattern diagram is represented by $2\theta$ in the X-ray diffraction, three sharp peaks around 39°, 41°, and 43° due to reflection on the MgO substrate are observed. A peak at 31° is found due to reflection in a CFGG(002) direction, and an obtuse peak around 64° is found due to reflection in a CFGG(004) direction. A peak at 44° is found due to reflection in an Ag(002) direction, and an obtuse peak around 60° is found due to reflection in a CuZn(002) direction. Therefore, by examining a crystal structure, it has been found that each of a Cr layer, an Ag layer, a CuZn layer, and a CFGG layer is oriented in a (001) direction from the result illustrated in FIG. 2.

Figure 3:
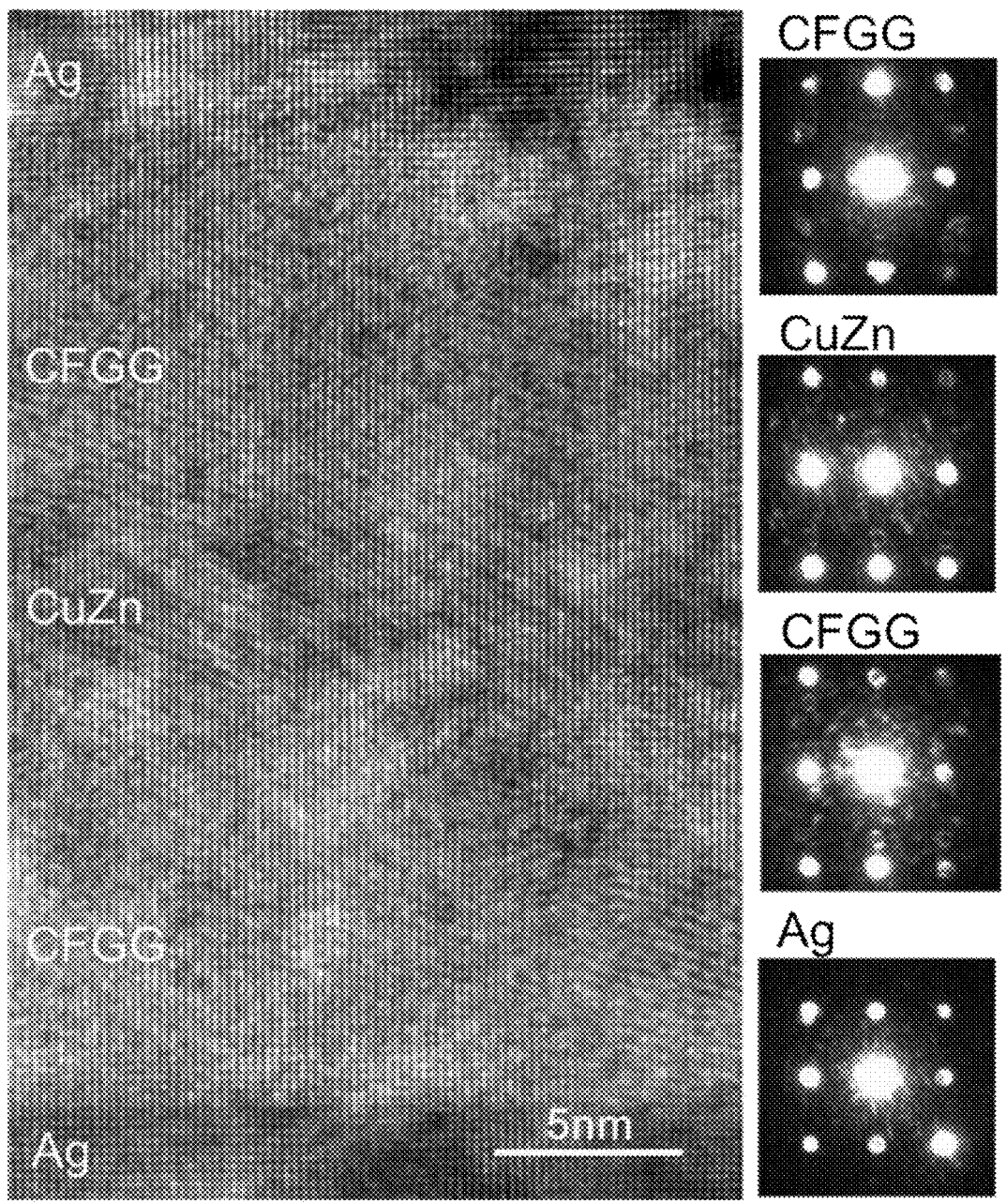
FIG. 3 illustrates a cross-sectional transmission electron micrograph and electron diffraction images of layers after the same sample as in FIG. 2 is annealed at 300° C.

FIG. 3 illustrates a cross-sectional transmission electron micrograph and electron diffraction images of layers after the same sample as in FIG. 2 is annealed at 300° C. In order to improve a crystal structure of a CFGG thin film, the same sample as in FIG. 2 has been annealed at 300 to 400° C. In the CPPGMR element film having the above stacked configuration, all the layers from the single crystal MgO substrate 11 to an upper Ag cap layer 16a have been grown epitaxially while being oriented in (001) direction. In the result of the electron diffraction, diffraction due to a B2 ordered structure of CuZn is not found. Therefore, it is considered that the spacer layer 14 has a disordered bcc structure of CuZn. An equilibrium diagram indicates that CuZn is an alloy having a B2 ordered structure. However, a thin film for CPPGMR was manufactured, and it was found that CuZn did not have a B2 ordered structure but was a disordered alloy having a bcc structure.

Next, the element structure in FIG. 4 will be described in detail. In FIG. 4, note that the same sign will be given to a component having the same function as in FIG. 1, and description thereof will be omitted. In FIG. 4, a silicon oxide layer 17 is disposed around the lower ferromagnetic layer 13, the spacer layer 14, the upper ferromagnetic layer 15, and the cap layer 16 illustrated in FIG. 1, and is stacked on the Ag base layer 12b. A copper electrode layer 18 is stacked on the silicon oxide layer 17 and the cap layer 16. A constant current source 19 is connected to the Ag base layer 12b and the copper electrode layer 18 via leads 20a and 20b, and supplies a constant current in a direction perpendicular to a film surface of the CPPGMR element. A voltmeter 21 is connected to the Ag base layer 12b and the copper electrode layer 18 via the leads 22a and 22b, and measures a voltage generated in a direction perpendicular to a film surface of the CPPGMR element. Electric resistance in a direction perpendicular to a film surface of the CPPGMR element can be measured from a current value of the constant current source 19 and a measured voltage value of the voltmeter 21. Therefore, change of electric resistance of the CPPGMR element with respect to a magnetic field can be examined.

Figure 5:
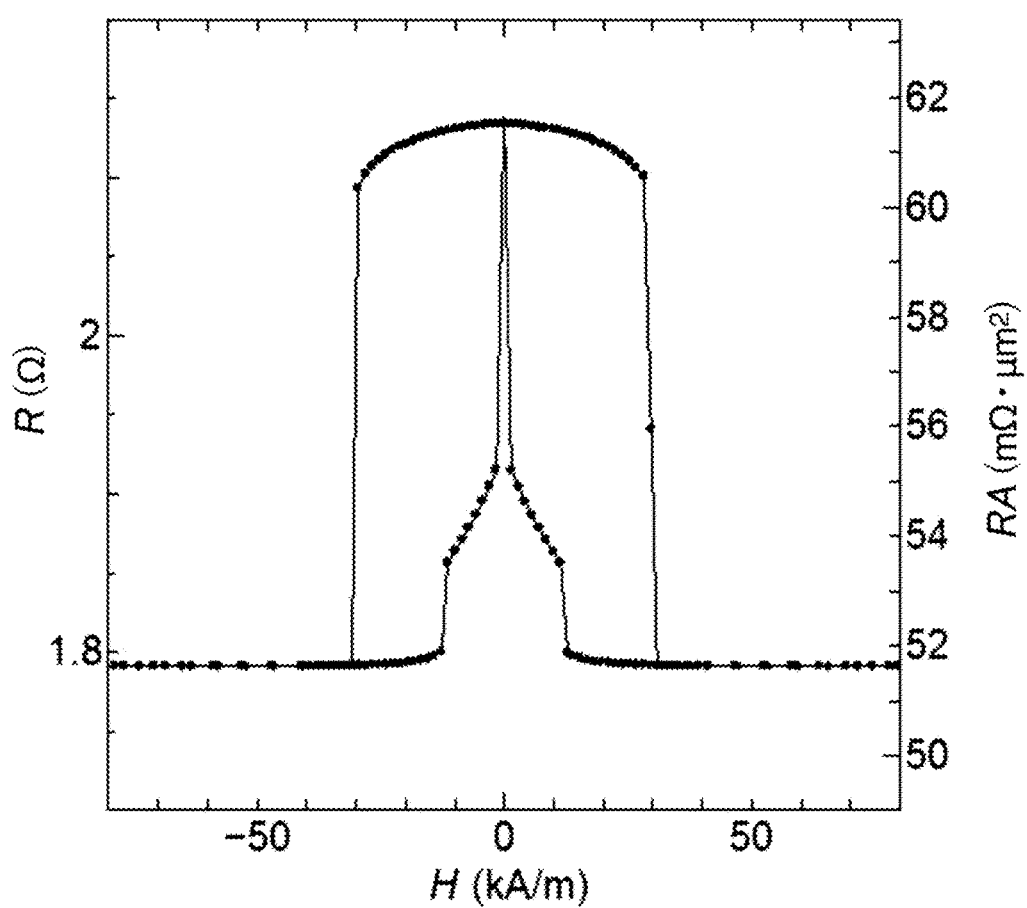
FIG. 5 is a diagram for explaining change of electric resistance×element area with respect to an applied magnetic field in an element using CuZn for a spacer layer.

FIG. 5 is an exemplary diagram for explaining change of electric resistance×element area with respect to an applied magnetic field in an element using CuZn for a spacer layer. The horizontal axis indicates the applied magnetic field H (kA/m), and the vertical axis indicates electric resistance× element area [$m\Omega \cdot m^2$]. When the applied magnetic field H (kA/m) is increased from −80 kA/m to +80 kA/m, the electric resistance×element area is about 51.6 [$m\Omega \cdot \mu m^2$] in a region of −80 kA/m to −10 kA/m, linearly increased about from 53.2 to 55.0 [$m\Omega \cdot \mu m^2$] in a region of −10 kA/m to 0 kA/m, gradually decreased from 62 to 60.5 [$m\Omega \cdot \mu m^2$] in a region of 0 kA/m to +30 kA/m, and is about 51.6 [$m\Omega \cdot \mu m^2$] again in a region of +30 kA/m to +80 kA/m. When the applied magnetic field H (kA/m) is decreased from +80 kA/m to −80 kA/m, a curve nearly symmetrical to the curve obtained when the applied magnetic field H is increased is obtained with an applied magnetic field H of 0 kA/m as a centerline.

Figure 6:
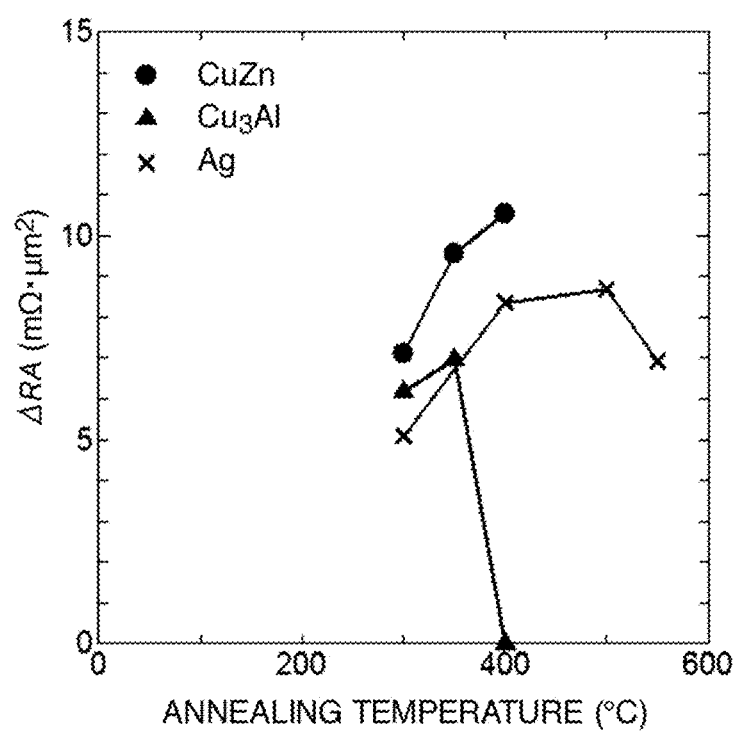
FIG. 6 is a diagram for explaining change amount of magnetoresistance×element area ($\Delta$RA) with respect to an annealing temperature.

FIG. 6 is a diagram for explaining change amount of magnetoresistance×element area (ΔRA) with respect to an annealing temperature. Here, the black dot, the black triangle mark, and the x mark indicate results of using CuZn, $Cu_3Al$, and Ag for the spacer layer, respectively. In FIG. 6, a change amount of electric resistance per unit area of the element ΔRA is plotted with respect to an annealing temperature Ta. When Ag according to a conventional method is used for the spacer layer, ΔRA=8.5 [$m\Omega \cdot \mu m^2$] is obtained at Ta=400° C. However, when CuZn according to the present invention is used for the spacer layer, ΔRA=10.5 [$m\Omega \cdot \mu m^2$] which is a larger value than prior is obtained at Ta=400° C., the annealing temperature Ta is lower than prior art, and breakage of a thin film layer due to annealing at a high temperature can be prevented.

EXAMPLE 2

Figure 7:
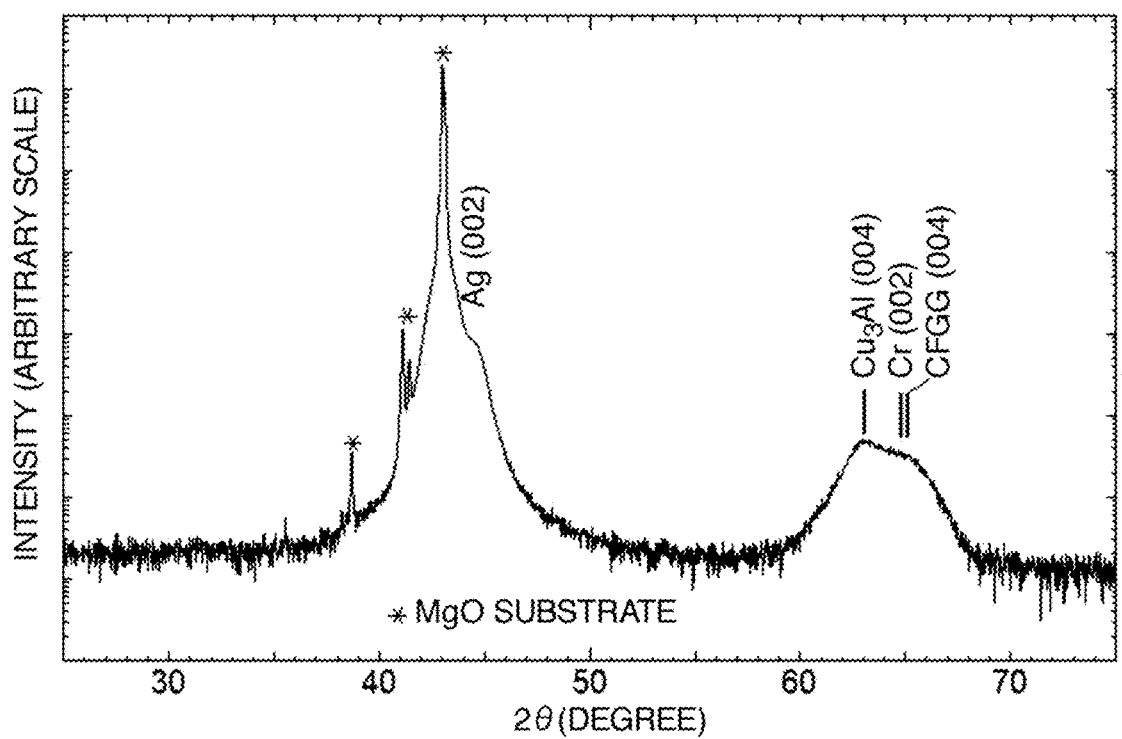
FIG. 7 is a diagram for explaining an X-ray diffraction pattern of a film obtained by stacking Cr(10)/Ag(10)/CFGG(5)/Cu$_3$Al(20) on an MgO(001) single crystal substrate from the bottom.

In Example 2, a stacked structure similar to that in Example 1 is used, but $Cu_3Al$ is used as the spacer layer 14 in place of CuZn. That is, a film was formed on an MgO substrate from the bottom by a sputtering method so as to have a film configuration of Cr(10)/Ag(100)/CFGG(10)/ $Cu_3Al$(5)/CFGG(10)/Ag(5)/Ru(8). Subsequently, a crystal structure was examined by X-ray diffraction. FIG. 7 is an X-ray diffraction pattern diagram of a CPPGMR element film having the stacked configuration in Example 2. When the pattern diagram is represented by $2\theta$ in the X-ray diffraction, three sharp peaks around 39°, 41°, and 43° due to reflection on the MgO substrate are observed. A peak at 31° should be found due to reflection in a CFGG(002) direction, but is not found because of being buried in a noise. An obtuse peak around 64° is found due to reflection in a CFGG(004) direction. A peak at 43° is found due to reflection in an Ag(002) direction, an obtuse peak around 60° is found due to reflection in a $Cu_3Al$(004) direction, and an obtuse peak around 64° is found due to reflection in a Cr(002) direction. Therefore, by examining a crystal structure, it has been found that each of a Cr layer, an Ag layer, a $Cu_3Al$ layer, and a CFGG layer is oriented in a (001) direction.

In order to examine the structure of $Cu_3Al$ in detail, a sample of Cr(10)/Ag(10)/CFGG(5)/$Cu_3Al$(20) having a thick $Cu_3Al$ layer was manufactured, and X-ray diffraction thereof was measured. As a result, as illustrated in FIG. 7, a (002) peak indicating a $D0_3$ ordered structure of $Cu_3Al$ was not found, but it was indicated that $Cu_3Al$ had a disordered bcc structure. According to an equilibrium diagram, it is known that a phase of a $D0_3$ type ordered structure exists in $Cu_3Al$ only at a high temperature. However, a thin film for CPPGMR was actually manufactured, and it was found that $Cu_3Al$ did not have a $DO_3$ type ordered structure but was a disordered alloy having a bcc structure.

Subsequently, the sample was annealed at 300 to 400° C. in a similar manner to Example 1, and then was subjected to fine processing to manufacture an element having a structure similar to that in FIG. 4. Change of electric resistance with respect to a magnetic field was examined. ΔRA obtained as a result of the measurement is illustrated in FIG. 6 illustrating the result of Example 1. At an annealing temperature Ta=300° C., when Ag was used for the spacer layer, ΔRA=5.0 [mΩ·μm$^2$] was obtained, but when $Cu_3Al$ according to the present invention was used for the spacer layer, ΔRA=6.2 [mΩ·μm$^2$] which was a larger value than prior art was obtained.

Note that the above embodiment uses an epitaxial film oriented in a (001) direction, but the crystal orientation is not limited thereto, but an epitaxial film oriented in an appropriate direction such as (110), (111), or (211) may be used. The structure of the substrate is not limited to a single crystal, but may be a polycrystal. Also in a case of the polycrystal, the crystal orientation may be oriented in an appropriate direction such as (001), (110), (111), or (211), or the crystal orientation not oriented at all may be possible.

By adding a layer of an antiferromagnetic substance such as an IrMn alloy or a PtMn alloy on the upper ferromagnetic layer as a pinning layer in addition to the structure illustrated in FIG. 1, and suppressing magnetization reversal of the upper ferromagnetic layer by exchange anisotropy, the upper ferromagnetic layer and the lower ferromagnetic layer magnetized antiparallel can be stabilized. The pinning layer may be inserted into a portion under the lower ferromagnetic layer.

INDUSTRIAL APPLICABILITY

The element utilizing a current-perpendicular-to-plane giant magnetoresistance (CPPGMR) effect according to the present invention is suitably used as a reading head for a magnetic disc, and can be used for detecting fine magnetic information.

What is claimed is:
1. A magnetoresistive element comprising:
a lower ferromagnetic layer and an upper ferromagnetic layer each containing a Heusler alloy; and
a spacer layer sandwiched between the lower ferromagnetic layer and the upper ferromagnetic layer, wherein the spacer layer contains an alloy having a bcc structure and the alloy is at least one alloy selected from the consisting of $Cu_3Al$, CuBe, $Ag_3Al$, AgMg, and AgZn.
2. The magnetoresistive element according to claim 1, wherein the spacer layer contains at least one alloy selected from the group consisting of an alloy having a bcc structure formed of Cu and Al.
3. The magnetoresistive element according to claim 1, wherein the alloy has a disordered bcc structure.
4. The magnetoresistive element according to claim 1, further comprising a substrate, wherein the substrate is at least one selected from the group consisting of a surface oxidized Si substrate, a silicon substrate, a glass substrate, a metal substrate, and an MgO substrate.
5. The magnetoresistive element according to claim 4, further comprising an orientation layer formed on the substrate to epitaxially grow the Heusler alloy in a predetermined crystal direction, wherein the orientation layer contains at least one metal selected from the group consisting of Ag, Al, Cu, Au, and Cr or an alloy thereof, and the crystal direction in which the Heusler alloy is grown epitaxially is (001) direction.
6. The magnetoresistive element according to claim 1, wherein each of the lower ferromagnetic layer and the upper ferromagnetic layer contains a Heusler alloy represented by the composition formula $Co_2AB$, wherein the aforementioned A is Cr, Mn or Fe, or a combination of two or more species thereof provided that the total amount of A is 1, and the aforementioned B is Al, Si, Ga, Ge, In or Sn, or a combination of two or more species thereof provided that the total amount of B is 1.
7. The magnetoresistive element according to claim 6, wherein each of the lower ferromagnetic layer and the upper ferromagnetic layer contains a Heusler ferromagnetic alloy having at least one of a B2 ordered structure and a $L2_1$ ordered structure, and the Heusler ferromagnetic alloy is selected from the group consisting of $Co_2Fe(Ga_xGe_{x-1})$ (0.25<x<0.6), $Co_2FeAl_{0.5}Si_{0.5}$, $Co_2MnSi$, $Co_2MnGe$, $Co_2FeAl$, and $Co_2FeSi$.
8. The magnetoresistive element according to claim 6, further comprising a base layer as an electrode for measuring magnetoresistance, wherein the base layer is disposed between an orientation layer and the lower ferromagnetic layer.
9. The magnetoresistive element according to claim 1, further comprising a cap layer for surface protection, stacked on the upper ferromagnetic layer, wherein the cap layer contains at least one metal selected from the group consisting of Ag, Al, Cu, Au, Ru, and Pt or an alloy thereof.
10. The magnetoresistive element according to claim 1, further comprising a pinning layer disposed on the upper ferromagnetic layer or under the lower ferromagnetic layer, wherein the pinning layer is a layer of an antiferromagnetic substance.
11. The magnetoresistive element according to claim 10, wherein the antiferromagnetic substance is an IrMn alloy or a PtMn alloy.
12. The magnetoresistive element according to claim 1, wherein the spacer layer contains at least one alloy selected from the group consisting of an alloy having a bcc structure formed of Cu and Be, an alloy having a bcc structure formed of Ag and Al, an alloy having a bcc structure formed of Ag and Mg, and an alloy having a bcc structure formed of Ag and Zn.
13. A current-perpendicular-to-plane giant magnetoresistance (CPPGMR) element including at least one spacer layer between at least two Heusler alloy thin films, characterized in that each of the Heusler alloy thin films contains a Heusler ferromagnetic alloy having a B2 ordered structure or a $L2_1$ ordered structure, the Heusler ferromagnetic alloy is a Heusler ferromagnetic alloy selected from the group consisting of $Co_2Fe(Ga_xGe_{x-1})$ (0.25<x<0.6), $Co_2FeAl_{0.5}Si_{0.5}$, $Co_2MnSi$, $Co_2MnGe$, $Co_2FeAl$, and $Co_2FeSi$, the spacer layer contains an alloy having a bcc structure, and the alloy is an alloy selected from the group consisting of CuZn, $Cu_3Al$, CuBe, $Ag_3Al$, AgMg, and AgZn.
14. The current-perpendicular-to-plane giant magnetoresistance (CPPGMR) element according to claim 13, wherein the alloy has a disordered bcc structure.
15. A magnetic head comprising the magnetoresistive element according to claim 1 or the current-perpendicular-to-plane giant magnetoresistance element according to claim 13.

16. A magnetic reproducing device comprising the magnetic head according to claim 15.

\* \* \* \* \*